United States Patent
Minner

(10) Patent No.: US 10,903,854 B2
(45) Date of Patent: Jan. 26, 2021

(54) REPLACING A SUBSET OF DIGITS IN A SEQUENCE

(71) Applicant: ENTIT SOFTWARE LLC, Sanford, NC (US)

(72) Inventor: Richard Minner, Cupertino, CA (US)

(73) Assignee: Micro Focus LLC, Santa Clara, CA (US)

(*) Notice: Subject to any disclaimer, the term of this patent is extended or adjusted under 35 U.S.C. 154(b) by 0 days.

(21) Appl. No.: 16/092,926

(22) PCT Filed: Apr. 20, 2016

(86) PCT No.: PCT/US2016/028463
§ 371 (c)(1),
(2) Date: Oct. 11, 2018

(87) PCT Pub. No.: WO2017/184132
PCT Pub. Date: Oct. 26, 2017

(65) Prior Publication Data
US 2019/0207627 A1    Jul. 4, 2019

(51) Int. Cl.
*H03M 13/09* (2006.01)
*G06F 11/10* (2006.01)
*H04L 1/00* (2006.01)

(52) U.S. Cl.
CPC ....... *H03M 13/096* (2013.01); *G06F 11/1004* (2013.01); *H04L 1/0061* (2013.01)

(58) Field of Classification Search
CPC .................. G06F 12/0253; H03M 13/096
See application file for complete search history.

(56) References Cited

U.S. PATENT DOCUMENTS 8,714,447 B1 * 5/2014 Bertrand .................. G06K 5/00
                                                              235/380
8,958,562 B2    2/2015 Spies et al.
(Continued)

FOREIGN PATENT DOCUMENTS

WO    WO2010045154 A1    4/2010

OTHER PUBLICATIONS

Braden, R., et al., Computing the Internet Checksum, BBN Laboratories, Network Working Group, Sep. 1988, 48 pages.
(Continued)

*Primary Examiner* — Steve N Nguyen

(57) ABSTRACT

In one example in accordance with the present disclosure, a method may include receiving a digit sequence including a subset of N digits encoded with semantic information and determining a set of possible combinations for the N digits in the subset. The method may also include establishing a mapping between each possible combination in the set of possible combinations and a corresponding integer sequence belonging to a set of integer sequences. Each integer sequence in the set of integer sequences is of the length of N−1. The method may also include identifying a selected integer sequence corresponding to the subset and replacing n−1 digits from the subset with the selected integer sequence. The method may also include replacing a digit of the subset with a digit value calculated to produce a valid checksum for the entire first digit sequence, wherein the first digit is not included in the n−1 digits.

20 Claims, 5 Drawing Sheets

(56) References Cited

U.S. PATENT DOCUMENTS

| | | | |
|---|---|---|---|
| 2004/0054501 A1 | 3/2004 | Barthel et al. | |
| 2012/0324555 A1 | 12/2012 | Chambers | |
| 2013/0276103 A1 | 10/2013 | Rautenbach et al. | |
| 2014/0122340 A1 | 5/2014 | Flitcroft | |
| 2015/0130645 A1* | 5/2015 | Dupont | H03M 7/42 |
| | | | 341/60 |
| 2015/0134972 A1 | 5/2015 | Martin | |
| 2015/0326388 A1 | 11/2015 | Sim | |
| 2017/0141920 A1* | 5/2017 | Herder, III | G06F 21/32 |
| 2019/0260397 A1* | 8/2019 | Wu | H03M 13/3707 |

OTHER PUBLICATIONS

International Searching Authority., International Search Report and Written Opinion dated Jan. 11, 2017 for PCT Application No. PCT/US2016/028463 Filed Apr. 20, 2016, 13 pages.

* cited by examiner

REPLACING A SUBSET OF DIGITS IN A SEQUENCE

BACKGROUND

Digit-sequence checksums may be used to verify data integrity. A checksum is a small portion of a larger block of digital data that may be used to detect errors which may have been introduced during transcription, transmission, storage, etc. A checksum function may utilize a checksum digit to verify the checksum.

BRIEF DESCRIPTION OF THE DRAWINGS

The following detailed description references the drawings, wherein.

DETAILED DESCRIPTION

Certain systems and/or applications may be implemented that disregard checksum validation and that produce application-specific digit sequences that fail a given checksum validation check. It can then be very costly to integrate these nominally invalid application-specific digit sequences into other data processing systems that enforce the checksum validation. Examples disclosed herein may transform the nominally invalid application specific digit sequences into checksum-valid sequences upon entry into the checksum-validating data processing system, and then transform the checksum-valid sequences back upon exit from such systems. Importantly, the examples described herein may losslessly transform the nominally invalid application specific digit sequences into checksum-valid sequences so that any semantic information encoded in the application-specific digit sequences is preserved.

An example method may include receiving a first digit sequence including a subset of N digits encoded with semantic information and determining a set of possible combinations for the N digits in the subset, wherein each possible combination in the set is N digits long. The method may also include establishing a mapping between each possible combination in the set of possible combinations and a corresponding integer sequence belonging to a set of integer sequences, wherein each integer sequence in the set of integer sequences is of the length of N−1. The method may also include identifying a selected integer sequence corresponding to the subset, replacing n−1 digits from the subset with the selected integer sequence and replacing a digit of the subset with a digit value calculated to produce a valid checksum for the entire first digit sequence, wherein the first digit is not included in the n−1 digits.

Figure 1:
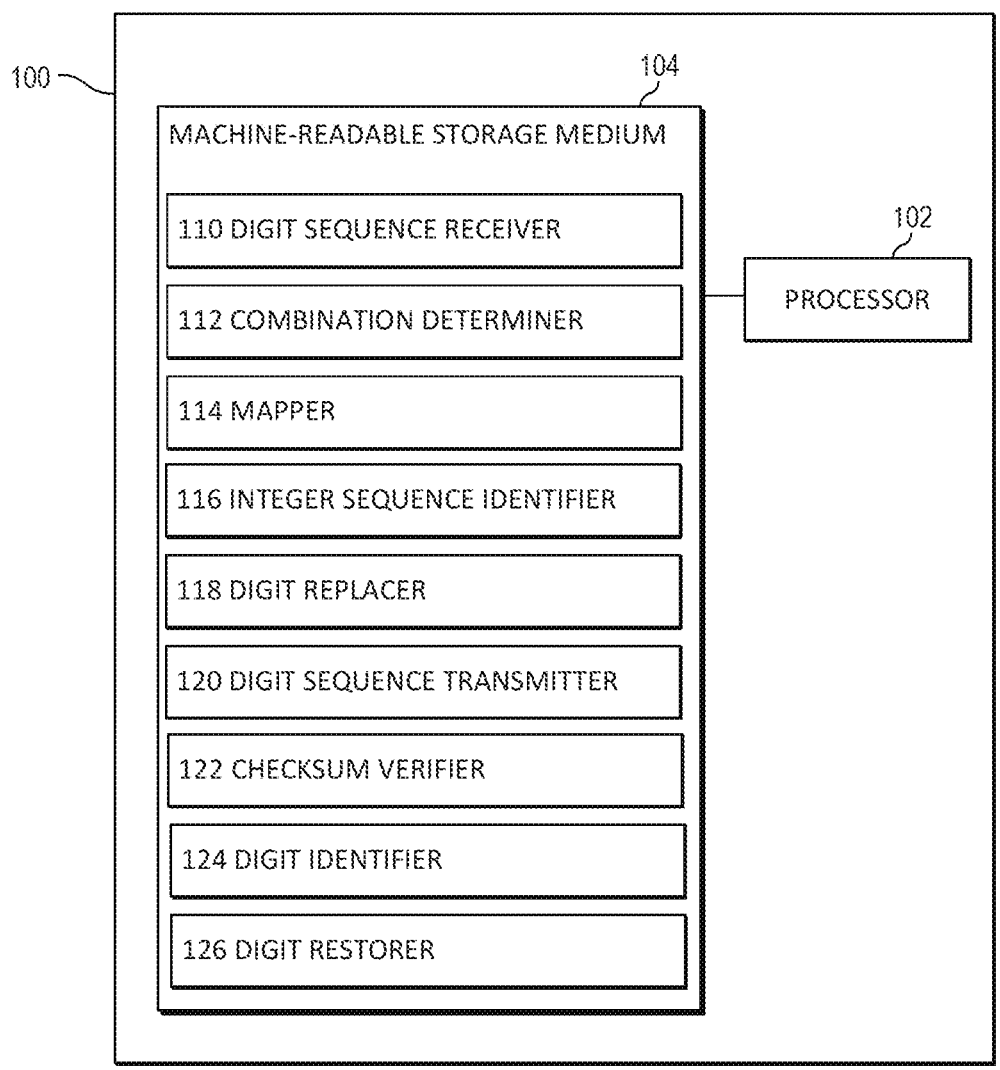
FIG. 1 is a block diagram of an example system for replacing a subset of digits in a sequence.

FIG. 1 is a block diagram of an example system 100 for replacing a subset of digits in a sequence. System 100 may include a processor 102 and a memory 104 that may be coupled to each other through a communication link (e.g., a bus). Processor 102 may include a Central Processing Unit (CPU) or another suitable hardware processor. In some examples, memory 104 may store machine readable instructions executed by processor 102 for system 100. Memory 104 may include any volatile memory, non-volatile memory, or any suitable combination of volatile and non-volatile memory. Memory 104 may comprise Random Access Memory (RAM), Read-Only Memory (ROM), flash memory, and/or other suitable memory. Memory 104 may also include a random access non-volatile memory that can retain content when the power is off.

Memory 104 stores instructions to be executed by processor 102 including instructions for digit sequence receiver 110, combination determiner 112, mapper 114, integer sequence identifier 116, digit replacer 118, digit sequence transmitter 120, checksum verifier 122, digit identifier 124, list generator 126, digit restorer 128, and/or other components. According to various implementations, system 100 may be implemented in hardware and/or a combination of hardware and programming that configures hardware. Furthermore, in FIG. 1 and other Figures described herein, different numbers of components or entities than depicted may be used.

Processor 102 may execute instructions of digit sequence receiver 110 to receive a first digit sequence. The first digit sequence may be used for an application that does not expect a valid checksum. The first digit sequence may include a subset of N digits encoded with semantic information. The subset of N digits may be a set of consecutive digits in the first digit sequence. The subset of N digits may be noncontiguous. The digit sequence may also be a structured digit sequence, such as a credit card number. For example, an example structured digit sequence may be "9 9 7 7 7 4 3 2 1." This sequence is of a length of nine digits and a subset of three of the nine digits may encode certain semantics. Of course, this is only an example and combination receiver 110 may receive digit sequences of various lengths with subsets of various lengths encoded with semantic information. Example semantic information could include security information, network information, etc. The subset of digits may or may not be consecutive.

Processor 102 may execute instructions of combination determiner 112 to determine a set of possible combinations for the N digits in the subset. Each possible combination in the set may be N digits long. An application may encode semantic information in the subset and may limit the number of possible combinations for the subset. For example, given a first digit sequence of a 9 digit length, an application may encode some particular information in the $3^{rd}$, $4^{th}$ and $5^{th}$ digits of the sequence, and that there are no more than 100 choices encoded, by design. Combination determiner 112 may then determine all of the possible combinations supported by the application for the three digits. For example, a certain application may support three possible combinations for the $3^{rd}$, $4^{th}$ and $5^{th}$ digits. An example list of all possible combinations supported by the application for the subset may look something like what is shown in Table 1 below.

TABLE 1

| |
|---|
| 3 4 5 |
| 7 7 7 |
| 9 6 3 |

In the example list depicted in Table 1, there may be three possible combinations for the $3^{rd}$, $4^{th}$ and $5^{th}$ digits encoded by design. The remaining digits ($1^{st}$, $2^{nd}$, $6^{th}$, $7^{th}$, $8^{th}$ and $9^{th}$ digits) may be any numbers.

Processor 102 may execute instructions of mapper 114 to establish a mapping between each possible combination in the set of possible combinations and a corresponding integer sequence belonging to a set of integer sequences. Each integer sequence in the set of integer sequences may be of the length of N−1. Each possible combination may be mapped to a single corresponding integer sequence. Likewise, each subset may correspond to a single corresponding integer sequence. Mapper 114 may generate the set of possible combinations in a first ascending order and generate the set of integer sequences in ascending order. The ascending order for the set of integer sequences may begin at 00. A total number of integer sequences in the ascending order may not exceed $10^{(N-1)}$. For each possible combination in the set of possible combinations in the ascending order, mapper 114 may select, starting from the lowest possible combination in the set of possible combinations, an unmapped possible combination and map the selected possible combination to the lowest available integer sequence belonging to the set of integer sequences.

Using the above example (described above in reference to combination determiner 112), mapper 114 may establish a mapping from the 2-digit sequences 00 up to 99 onto the list of 3-digit sequences. Specifically, mapper 114 may generate the set of possible combinations in ascending order. Mapper may then select the first unmapped possible combination starting from the lowest possible combination. Assuming that none of the possible combinations have been mapped and that none of the integer sequences have been mapped, mapper 114 may select the lowest possible combination and map that combination to the lowest available integer sequence (00). Mapper 114 may continue this routine until each possible combination is mapped to an integer sequence. Since, in this example, there are no more than 100 choices (as explained above in reference to combination determiner 112), the total number of possible combinations can be mapped to the 100 possible integer combinations (00-99). It is important to note that although each possible combination is mapped to an integer sequence, each integer sequence may not be mapped to a possible combination. An example list of all possible combinations may look something like what is shown in Table 2 below.

TABLE 2

3 4 5 <−> 0 0
7 7 7 <−> 0 1
9 6 3 <−> 0 2

In the example CBC operation depicted in Table 2, there are three possible combinations for the $3^{rd}$, $4^{th}$ and $5^{th}$ digits encoded by design. Mapper 114 may select the first unmapped possible combination "345" (as described above in reference to Table 1) and map the first unmapped possible combination to the lowest available integer sequence (00). Similarly, mapper 114 may select the second unmapped possible combination "777" (as described above in reference to Table 1) and map the second unmapped possible combination to the lowest available integer sequence (01). Similarly, mapper 114 may select the third unmapped possible combination "963" (as described above in reference to Table 1) and map the third unmapped possible combination to the lowest available integer sequence (02).

Processor 102 may execute instructions of integer sequence identifier 116 to identify a selected integer sequence corresponding to the subset. An application, such as the first application, may have specific rules concerning which digit(s) in the sequence are replaced with the integer sequence and which digit(s) in the subset are replaced with the digit value. Integer sequence identifier 116 may identify the selected integer sequence corresponding to the subset using a mapping of possible combinations to integer sequences (such as the mapping discussed above in reference to mapper 114). Again turning to the example described above, integer sequence identifier 116 may use the mapping to determine the 2 digit integer sequence between 00-99 ("01") that corresponds to the three digit sequence originally found the $3^{rd}$, $4^{th}$ and $5^{th}$ digits ("777") of the nine digit sequence.

Processor 102 may execute instructions of digit replacer 118 to replace n−1 digits from the subset with the selected integer sequence. Digit replacer 118 may Select which digits from the subset to be replaced with the selected integer sequence according to the specific rules corresponding to the application. Again turning to the example described above, digit replacer 118 may replace the $3^{rd}$ and $4^{th}$ digits with the two digit integer sequence. Digit replacer 118 may also replace a digit of the subset with a digit value calculated to produce a valid checksum for the entire first digit sequence. The first digit may not be included in the n−1 digits. The digit of the subset replaced with the digit value may chronologically be any digit of the subset, such as the first digit of the subset, last digit of the subset, etc. Again turning to the example described above, digit replacer 118 may replace the $5^{th}$ digit of the ten digit sequence with the digit value.

Turning again to the example described above, digit replacer 118 may replace the $3^{rd}$ ("7") and $4^{th}$ ("7") digits of the 9-digit sequence with the selected integer sequence "01" (as described above in reference to mapper 114 and Table 2), and may replace the $5^{th}$ digit of the subset with a digit value calculated to produce a valid checksum for the entire first digit sequence. After replacement, the original 9 digit sequence "9 9 7 7 7 4 3 2 1" may be represented as 9 9 0 1 L 4 3 2 1, where L represents a digit value calculated to produce a valid checksum for the entire first digit sequence. The digit value may be determined using one or more checksum algorithms.

In the example discussed above in reference to Tables 1 and 2, the digit value may be "4," creating a final 9 digit sequence of "9 9 0 1 4 4 3 2 1."

System 100 may also be used to restore the subset of digits replaced in the sequence (e.g. as discussed herein with respect to digit replacer 118). Importantly, the digits can be replaced losslessly such that any information encoded in the original sequence is restored. Processor 102 may execute instructions of digit sequence transmitter 120 to transmit the first digit sequence with the selected integer sequence and the digit value to a second application. The first digit sequence may be used for an application that does not expect a valid checksum. The second application may expect a valid checksum.

Processor 102 may execute instructions of checksum verifier 122 to verify the checksum of the first digit sequence using the digit value. The checksum may be verified according to the rules of the checksum algorithm being used. Processor 102 may execute instructions of digit identifier 124 to identifying the n−1 digits (e.g. as discussed herein with respect to digit replacer 118) that matches the selected integer sequence. Digit identifier 124 may also identify the digit value (e.g. as discussed herein with respect to digit replacer 118) in the selected integer sequence. Once again using the example above, checksum verifier 122 may identify the integer sequence "01" in the "9 9 0 1 4 4 3 2 1."

Processor 102 may execute instructions of digit restorer 126 to replace the selected integer sequence and the digit value with the n−1 digits. Once again using the example above, checksum verifier 122 may replace the integer sequence "01" and the digit value "4" in the digit sequence "9 9 0 1 4 4 3 2 1" with the three digit sequence originally found the $3^{rd}$, $4^{th}$ and $5^{th}$ digits ("777") of the nine digit sequence to recreate the original nine digit sequence of "9 9 7 7 7 4 3 2 1." The second application, and more specifically digit restorer 126, may have access to the mappings of integer sequences and digit sequences (e.g. as discussed herein with respect to mapper 114). Moreover, the second application, and digit restorer 126, may have access to the rules of the first application concerning which digit(s) in the sequence are replaced with the integer sequence and which digit(s) in the subset are replaced with the digit value. Digit restorer 126 may identify which of the n−1 digits to replace with the selected integer sequence and the digit value based on the rules of the first application.

Figure 2:
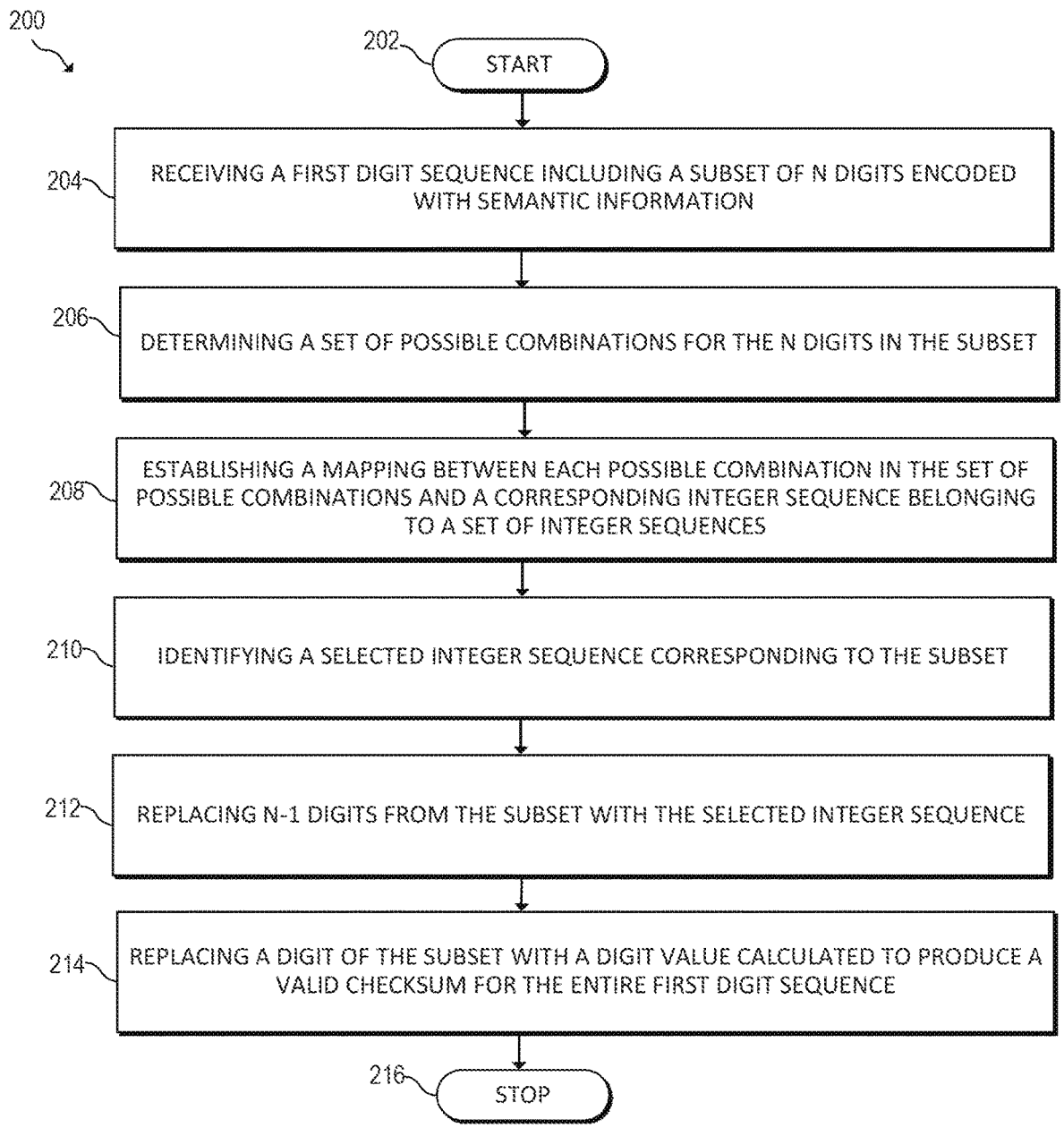
FIG. 2 is a flowchart of an example method for replacing a subset of digits in a sequence.

FIG. 2 is a flowchart of an example method 200 for replacing a subset of digits in a sequence. Method 200 may be described below as being executed or performed by a system, for example, system 100 of FIG. 1, system 400 of FIG. 4, and/or system 500 of FIG. 5. Other suitable systems and/or computing devices may be used as well.

Method 200 may be implemented in the form of executable instructions stored on at least one machine-readable storage medium of the system and executed by at least one processor of the system. The processor may include a Central Processing Unit (CPU) or another suitable hardware processor. The machine-readable storage medium may be non-transitory. Method 200 may be implemented in the form of electronic circuitry (e.g., hardware). At least one block of method 200 may be executed substantially concurrently or in a different order than shown in FIG. 2. Method 200 may include more or less blocks than are shown in FIG. 2. Some of the blocks of method 200 may, at certain times, be ongoing and/or may repeat.

Method 200 may start at block 202 and continue to block 204, where the method may include receiving a first digit sequence including a subset of N digits encoded with semantic information. The first digit sequence may be used for an application that does not expect a valid checksum. The subset of N digits may be a set of consecutive digits in the first digit sequence. At block 206, the method may include determining a set of possible combinations for the N digits in the subset. Each possible combination in the set may be N digits long. At block 208, the method may include establishing a mapping between each possible combination in the set of possible combinations and a corresponding integer sequence belonging to a set of integer sequences. Each possible combination may be mapped to a different corresponding integer sequence. Each integer sequence in the set of integer sequences may be of the length of N−1.

Establishing the mapping may include generating the set of possible combinations in a first ascending order and generating the set of integer sequences in ascending order. A total number of integer sequences in the ascending order may not exceed $10^{(N-1)}$. For each possible combination in the set of possible combinations in the ascending order, the method may include selecting, starting from the lowest possible combination in the set of possible combinations, an unmapped possible combination and mapping the selected possible combination to the lowest available integer sequence belonging to the set of integer sequences.

At block 210, the method may include identifying a selected integer sequence corresponding to the subset. At block 212, the method may include replacing n−1 digits from the subset with the selected integer sequence. At block 214, the method may include replacing a digit of the subset with a digit value calculated to produce a valid checksum for the entire first digit sequence, wherein the first digit is not included in the n−1 digits. Method 200 may eventually continue to block 216, where method 200 may stop.

Figure 3:
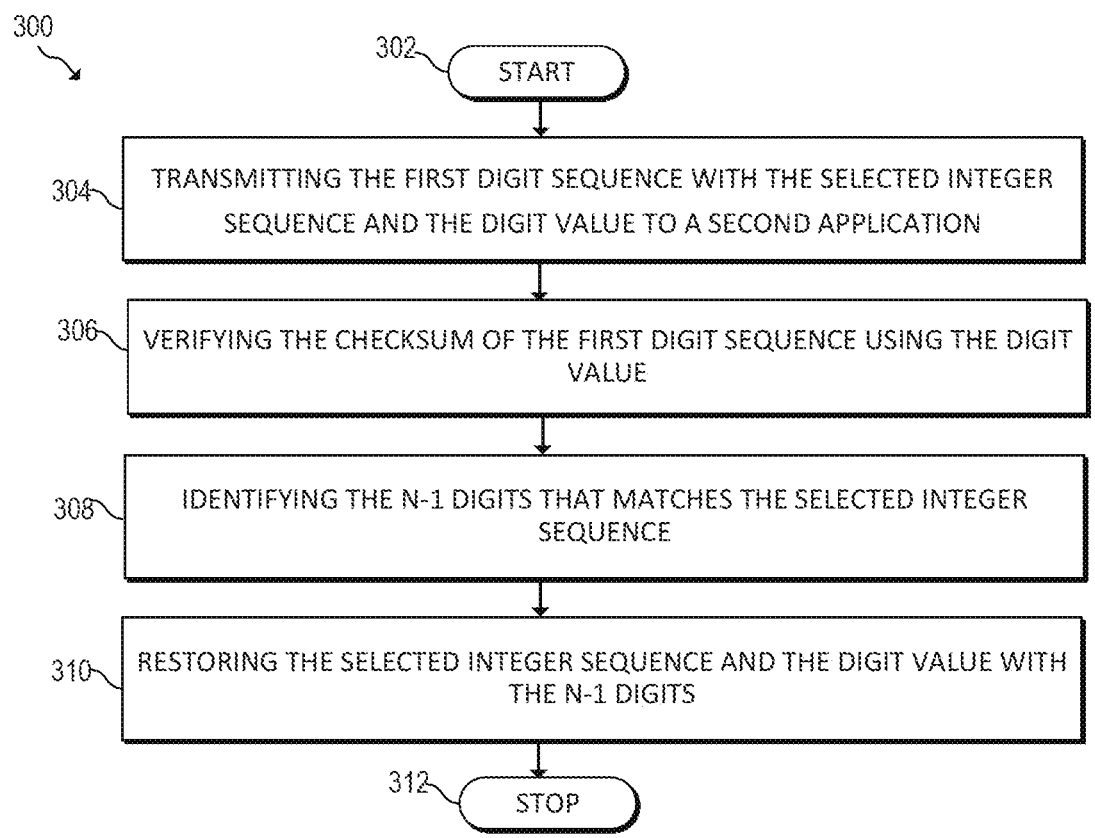
FIG. 3 is a flowchart of an example method for restoring a subset of digits in a sequence.

FIG. 3 is a flowchart of an example method 300 for restoring a subset of digits in a sequence. Method 300 may be described below as being executed or performed by a system, for example, system 100 of FIG. 1, system 400 of FIG. 4, and/or system 500 of FIG. 5. Other suitable systems and/or computing devices may be used as well.

Method 300 may be implemented in the form of executable instructions stored on at least one machine-readable storage medium of the system and executed by at least one processor of the system. The processor may include a Central Processing Unit (CPU) or another suitable hardware processor. The machine-readable storage medium may be non-transitory. Method 300 may be implemented in the form of electronic circuitry (e.g., hardware). At least one block of method 300 may be executed substantially concurrently or in a different order than shown in FIG. 3. Method 300 may include more or less blocks than are shown in FIG. 3. Some of the blocks of method 300 may, at certain times, be ongoing and/or may repeat.

Method 300 may start at block 302 and continue to block 304, where the method may include transmitting the first digit sequence with the selected integer sequence and the digit value to a second application. The second application may expect a valid checksum. At block 306, the method may include verifying the checksum of the first digit sequence using the digit value. At block 308, the method may include identifying the n−1 digits that matches the selected integer sequence. At block 310, the method may include restoring the selected integer sequence and the digit value with the n−1 digits. Method 300 may eventually continue to block 312, where method 300 may stop.

Figure 4:
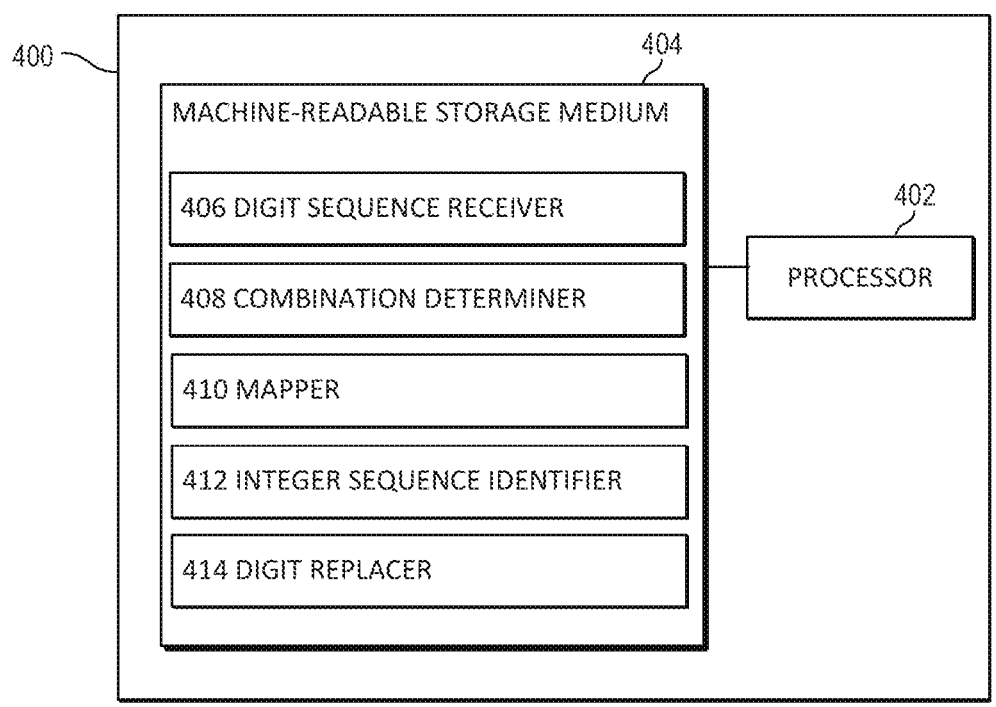
FIG. 4 is a block diagram of an example system for replacing a subset of digits in a sequence.

FIG. 4 is a block diagram of an example system 400 for replacing a subset of digits in a sequence. System 400 may include a processor 402 and a memory 404 that may be coupled to each other through a communication link (e.g., a bus). Processor 402 may include a Central Processing Unit (CPU) or another suitable hardware processor. In some examples, memory 404 stores machine readable instructions executed by processor 402 for system 400. Memory 404 may include any volatile memory, non-volatile memory, or any suitable combination of volatile and non-volatile memory. Memory 404 may comprise Random Access Memory (RAM), Read-Only Memory (ROM), flash memory, and/or other suitable memory. Memory 404 may also include a random access non-volatile memory that can retain content when the power is off.

Memory 404 stores instructions to be executed by processor 402 including instructions for digit sequence receiver 406, combination determiner 408, mapper 410, integer sequence identifier 412 and digit replacer 414. The components of system 400 may be implemented in the form of executable instructions stored on at least one machine-readable storage medium of system 400 and executed by at least one processor of system 500. The machine-readable storage medium may be non-transitory. Each of the components of system 400 may be implemented in the form of at least one hardware device including electronic circuitry for implementing the functionality of the component.

Processor 402 may execute instructions of digit sequence receiver 406 to receive a first digit sequence including a subset of N digits. The first digit sequence may be used for an application that does not expect a valid checksum. Processor 402 may execute instructions of combination determiner 408 to determine a set of possible combinations for the N digits in the subset, wherein each possible combination in the set is N digits long. Processor 402 may execute instructions of mapper 410 to establish a mapping between each possible combination in the set of possible combinations and a corresponding integer sequence belonging to a set of integer sequences. Each possible combination may be mapped to a different corresponding integer sequence. Each integer sequence in the set of integer sequences may be of the length of N−1.

Establishing the mapping may include generating the set of possible combinations in a first ascending order and generating the set of integer sequences in ascending order. A total number of integer sequences in the ascending order may not exceed $10^{(N-1)}$. For each possible combination in the set of possible combinations in the ascending order, the method may include selecting, starting from the lowest possible combination in the set of possible combinations, an unmapped possible combination and mapping the selected possible combination to the lowest available integer sequence belonging to the set of integer sequences.

Processor 402 may execute instructions of integer sequence identifier 412 to identify a selected integer sequence corresponding to the subset. Processor 402 may execute instructions of digit replacer 414 to replace n−1 digits from the subset of the first digit sequence with the elected integer sequence and a checksum to create a transformed digit sequence.

Figure 5:
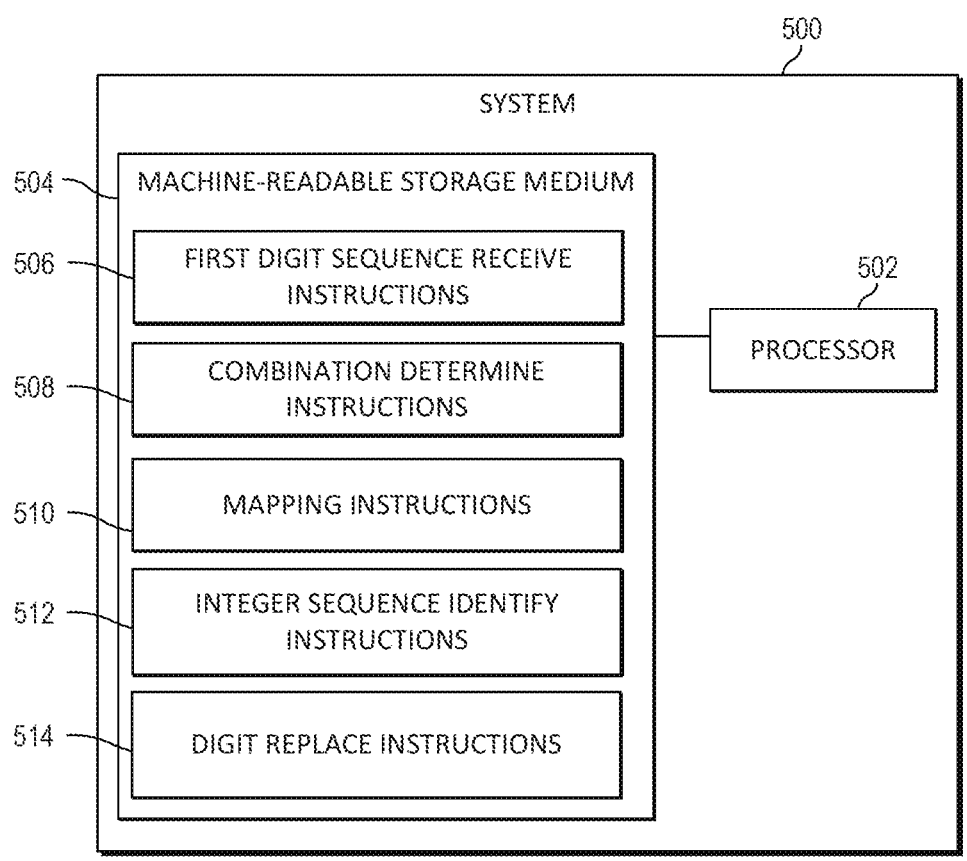
FIG. 5 is a block diagram of an example system for replacing a subset of digits in a sequence.

FIG. 5 is a block diagram of an example system 500 for replacing a subset of digits in a sequence. System 500 may be similar to system 100 of FIG. 1, for example. In the example illustrated in FIG. 5, system 500 includes a processor 502 and a machine-readable storage medium 504. Although the following descriptions refer to a single processor and a single machine-readable storage medium, the descriptions may also apply to a system with multiple processors and multiple machine-readable storage mediums. In such examples, the instructions may be distributed (e.g., stored) across multiple machine-readable storage mediums and the instructions may be distributed (e.g., executed by) across multiple processors.

Processor 502 may be at least one central processing unit (CPU), microprocessor, and/or other hardware devices suitable for retrieval and execution of instructions stored in machine-readable storage medium 504. In the example illustrated in FIG. 5, processor 502 may fetch, decode, and execute instructions 506, 508, 510, 512 and 514 to replace a subset of digits in a sequence. Processor 502 may include at least one electronic circuit comprising a number of electronic components for performing the functionality of at least one of the instructions in machine-readable storage medium 504. With respect to the executable instruction representations (e.g., boxes) described and shown herein, it should be understood that part or all of the executable instructions and/or electronic circuits included within one box may be included in a different box shown in the figures or in a different box not shown.

Machine-readable storage medium 504 may be any electronic, magnetic, optical, or other physical storage device that stores executable instructions. Thus, machine-readable storage medium 504 may be, for example, Random Access Memory (RAM), an Electrically-Erasable Programmable Read-Only Memory (EEPROM), a storage drive, an optical disc, and the like. Machine-readable storage medium 504 may be disposed within system 500, as shown in FIG. 5. In this situation, the executable instructions may be "installed" on the system 500. Machine-readable storage medium 504 may be a portable, external or remote storage medium, for example, that allows system 500 to download the instructions from the portable/external/remote storage medium. In this situation, the executable instructions may be part of an "installation package". As described herein, machine-readable storage medium 504 may be encoded with executable instructions for context aware data backup. The machine-readable storage medium may be non-transitory.

Referring to FIG. 5, first digit sequence receives instructions 506, when executed by a processor (e.g., 502), may cause system 500 to receive a first digit sequence including a subset of N digits encoded with semantic information. The first digit sequence may be used by a first application that does not expect a valid checksum. Combination determine instructions 508, when executed by a processor (e.g., 502), may cause system 500 to determine a set of possible combinations for the N digits in the subset. Each possible combination in the set may be N digits long. Mapping instructions 510, when executed by a processor (e.g., 502), may cause system 500 to establish a mapping between each possible combination in the set of possible combinations and a corresponding integer sequence belonging to a set of integer sequences. Each possible combination may be mapped to a different corresponding integer sequence. Each integer sequence in the set of integer sequences may be of the length of N−1.

Establishing the mapping may include generating the set of possible combinations in a first ascending order and generating the set of integer sequences in ascending order. A total number of integer sequences in the ascending order may not exceed $10^{(N-1)}$. For each possible combination in the set of possible combinations in the ascending order, the method may include selecting, starting from the lowest possible combination in the set of possible combinations, an unmapped possible combination and mapping the selected possible combination to the lowest available integer sequence belonging to the set of integer sequences.

Integer sequence identify instructions 512, when executed by a processor (e.g., 502), may cause system 500 to identify a selected integer sequence corresponding to the subset. Digit replace instructions 514, when executed by a processor (e.g., 502), may cause system 500 to replace n−1 digits from the subset of the first digit sequence with the selected integer sequence and a checksum to create a transformed digit sequence.

The foregoing disclosure describes a number of examples for replacing a subset of digits in a sequence. The disclosed examples may include systems, devices, computer-readable storage media, and methods for replacing a subset of digits in a sequence. For purposes of explanation, certain examples are described with reference to the components illustrated in FIGS. 1-5. The functionality of the illustrated components may overlap, however, and may be present in a fewer or greater number of elements and components. Further, all or part of the functionality of illustrated elements may co-exist or be distributed among several geographically dispersed locations. Further, the disclosed examples may be implemented in various environments and are not limited to the illustrated examples.

Further, the sequence of operations described in connection with FIGS. 1-5 are examples and are not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples.

The invention claimed is:

1. A method comprising:
receiving, by a processor, a first digit sequence including a subset of N digits encoded with semantic information, wherein the received first digit sequence is generated for a first application that does not expect valid checksums in digit sequences;
determining, by the processor, a set of possible combinations for the N digits in the subset of N digits, wherein each possible combination in the set of possible combinations is N digits long;
establishing, by the processor, a mapping between each possible combination in the set of possible combinations and a corresponding integer sequence belonging to a set of integer sequences, wherein each integer sequence in the set of integer sequences is of a length of N−1;
identifying, by the processor, a selected integer sequence corresponding to the subset of N digits;
transforming, by the processor, the first digit sequence by replacing N−1 digits from the subset of N digits with the selected integer sequence, and replacing a particular digit of the subset of N digits with a digit value calculated to produce a valid checksum for the entire first digit sequence, wherein the particular digit is not included in the replaced N−1 digits from the subset of N digits; and
transmitting, by the processor, the transformed first digit sequence to a second application, wherein the second application is to verify a checksum of the transformed first digit sequence.

2. The method of claim 1 comprising:
generating the set of possible combinations in a first ascending order;
generating the set of integer sequences in a second ascending order;
for each possible combination in the set of possible combinations in the first ascending order:
selecting, starting from a lowest possible combination in the set of possible combinations, a possible combination that is unmapped; and
mapping the selected possible combination to a lowest available integer sequence belonging to the set of integer sequences.

3. The method of claim 2 wherein a total number of integer sequences in the second ascending order does not exceed 10(N−1).

4. The method of claim 1 comprising:
verifying, by the second application, the checksum of the first digit sequence using the digit value.

5. The method of claim 4 comprising, after verifying the checksum of the first digit sequence:
restoring the first digit sequence by:
identifying the N−1 digits that matches the selected integer sequence; and
replacing the selected integer sequence in the transformed first digit sequence with the identified N−1 digits.

6. The method of claim 5 wherein restoring the first digit sequence further comprises replacing the digit value in the transformed first digit sequence with the particular digit of the subset of N digits.

7. The method of claim 1 wherein the subset of N digits is a set of consecutive digits in the first digit sequence.

8. A system comprising:
a processor; and
a non-transitory storage medium storing instructions executable on the processor to:
receive a first digit sequence including a subset of N digits, wherein the received first digit sequence is generated for a first application that does not expect valid checksums in digit sequences;
determine a set of possible combinations for the N digits in the subset of N digits, wherein each possible combination in the set of possible combinations is N digits long;
establish a mapping between each possible combination in the set of possible combinations and a corresponding integer sequence belonging to a set of integer sequences, wherein each integer sequence in the set of integer sequences is of a length of N−1;
identify a selected integer sequence corresponding to the subset of N digits;
replace N−1 digits from the subset of N digits of the first digit sequence with the selected integer sequence to create a transformed digit sequence; and
transmit the transformed digit sequence to a second application, wherein the second application is to verify a checksum of the transformed digit sequence.

9. The system of claim 8 including instructions to:
generate the set of possible combinations in a first ascending order; and
generate the set of integer sequences in a second ascending order.

10. The system of claim 9 including instructions to, for each possible combination in the set of possible combinations:
select, starting from a lowest possible combination in the set of possible combinations, a possible combination that is unmapped; and
map the selected possible combination to a lowest available integer sequence belonging to the set of integer sequences.

11. The system of claim 9 including instructions to replace a particular digit of the subset of N digits with a digit value calculated to produce a valid checksum for the entire transformed digit sequence, wherein the digit value is included in the transformed digit sequence, and wherein the particular digit is not included in the N−1 digits.

12. The system of claim 11, wherein the subset of N digits is a set of consecutive digits in the first digit sequence, and wherein the particular digit of the subset of N digits replaced with the digit value is chronologically a final digit of the subset.

13. The system of claim 11, comprising instructions to:
verify, by the second application, the checksum of the transformed digit sequence.

14. The system of claim 13, the instructions to restore the first digit sequence including instructions to:
restore the first digit sequence by:
identifying the N−1 digits that match the selected integer sequence;
replacing the selected integer sequence in the transformed digit sequence with the N−1 digits; and
replacing the digit value in the transformed digit sequence with the particular digit.

15. A non-transitory machine-readable storage medium encoded with instructions, the instructions executable by a hardware processor of a system to cause the system to:
- receive a first digit sequence including a subset of N digits encoded with semantic information, wherein the first digit sequence is used by a first application that does not expect valid checksums in digit sequences;
- determine a set of possible combinations for the N digits in the subset of N digits, wherein each possible combination in the set of possible combinations is N digits long;
- establish a mapping between each possible combination in the set of possible combinations and a corresponding integer sequence belonging to a set of integer sequences, wherein each integer sequence in the set of integer sequences is of a length of N−1;
- identify a selected integer sequence corresponding to the subset of N digits;
- replace N−1 digits from the subset of N digits of the first digit sequence with the selected integer sequence to create a transformed digit sequence; and
- transmit the transformed digit sequence to a second application, wherein the second application is to verify a checksum of the transformed digit sequence.

16. The non-transitory machine-readable storage medium of claim 15, wherein the instructions executable by the hardware processor of the system cause the system to:
- replace a particular digit of the subset of N digits with a digit value calculated to produce a valid checksum for the entire transformed digit sequence, wherein the digit value is included in the transformed digit sequence, and wherein the particular digit is not included in the N−1 digits.

17. The non-transitory machine-readable storage medium of claim 16, wherein the subset of N digits is a set of consecutive digits in the first digit sequence and wherein the particular digit of the subset of N digits replaced with the digit value is chronologically a final digit of the subset of N digits.

18. The non-transitory machine-readable storage medium of claim 15, wherein each possible combination is mapped to a different corresponding integer sequence.

19. The non-transitory machine-readable storage medium of claim 16, comprising instructions to:
- verify, by the second application, the checksum of the transformed digit sequence.

20. The non-transitory machine-readable storage medium of claim 19, comprising instructions to:
- restore the first digit sequence by:
  - identifying the N−1 digits that match the selected integer sequence;
  - replacing the selected integer sequence in the transformed digit sequence with the N−1 digits; and
  - replacing the digit value in the transformed digit sequence with the particular digit of the subset of N digits.

* * * * *